(12) United States Patent
Gerling

(10) Patent No.: US 7,300,617 B2
(45) Date of Patent: Nov. 27, 2007

(54) METHOD OF MAKING FUSION CAST ARTICLES

(76) Inventor: David Gerling, 27536 N. Marta La. Apt. 204, Santa Clarita, CA (US) 91387

(*) Notice: Subject to any disclaimer, the term of this patent is extended or adjusted under 35 U.S.C. 154(b) by 465 days.

(21) Appl. No.: 10/844,810

(22) Filed: May 13, 2004

(65) Prior Publication Data

US 2005/0252242 A1 Nov. 17, 2005

(51) Int. Cl.
*C23C 14/32* (2006.01)
*C24C 14/34* (2006.01)

(52) U.S. Cl. .................. 264/332; 264/206; 264/229

(58) Field of Classification Search ............... 264/332; 429/206, 229
See application file for complete search history.

(56) References Cited

U.S. PATENT DOCUMENTS

| | | | |
|---|---|---|---|
| 2,920,971 A | | 1/1960 | Stookey |
| 3,997,352 A | | 12/1976 | Beall |
| 4,959,257 A | | 9/1990 | Mukherjee |
| 5,462,887 A | | 10/1995 | Gluck |
| 5,628,933 A | | 5/1997 | Carter et al. |
| 5,972,527 A | * | 10/1999 | Kaijou et al. .............. 428/697 |
| 6,215,077 B1 | | 4/2001 | Utsumi et al. |
| 6,365,016 B1 | | 4/2002 | Iacovangelo et al. |
| 6,397,776 B1 | * | 6/2002 | Yang et al. ............ 118/723 MP |
| 6,534,183 B1 | | 3/2003 | Inoue |
| 6,669,830 B1 | * | 12/2003 | Inoue et al. ............ 204/298.13 |
| 6,991,750 B2 | * | 1/2006 | Majumdar et al. .......... 252/500 |
| 6,998,070 B2 | * | 2/2006 | Inoue et al. ............ 252/519.51 |
| 7,041,389 B2 | * | 5/2006 | Utsumi et al. .............. 428/690 |
| 2001/0008710 A1 | | 7/2001 | Takatsuji et al. |
| 2003/0160914 A1 | | 8/2003 | Ha |
| 2003/0221763 A1 | * | 12/2003 | Tateishi et al. ................ 156/67 |
| 2004/0180217 A1 | * | 9/2004 | Inoue et al. ................ 428/432 |

OTHER PUBLICATIONS

Thestrup et al, "Transparent conducting AZO and ITO films produced by pulsed laser ablation at 355nm", Applied Physics A 69 Suppl. pp. S807-S809, Dec. 28, 1999.*
Castenada et al, "Formation of Indium-doped Zinc Oxide Thin Films Using Chemical Spray Techniques: The improtance of acetic acid content in the aerosol solution and the substrates temperature for enhancing electrical transport", Thins Solids Filns col. 503 Issues 1-2, May 2006, pp. 212-218.*

* cited by examiner

*Primary Examiner*—Carlos Lopez
(74) *Attorney, Agent, or Firm*—Scott S. Servilla; Diehl Servilla LLC

(57) ABSTRACT

Fusion cast indium zinc oxide articles and methods of manufacturing fusion cast indium zinc articles are disclosed. The fusion cast indium zinc articles can be used as sputtering targets for forming transparent conductive films.

11 Claims, 1 Drawing Sheet

METHOD OF MAKING FUSION CAST ARTICLES

FIELD OF THE INVENTION

This invention relates to fusion cast indium zinc oxide articles and methods of manufacture.

BACKGROUND OF THE INVENTION

Various types of display devices, including but not limited to liquid crystal display devices, electrochromic displays, plasma displays, field emission displays and electroluminescent displays include transparent conductive coatings formed thereon. These transparent conductive coatings have several purposes, including the creation of circuits within these display devices. Transparent conductive coatings are also used as antistatic coatings on instrument panels, heating elements on aircraft windows and electrodes on solar cells. These materials can also be used as heat retaining and ultraviolet light-rejecting coatings on windows.

Transparent conductive oxide coatings operate at lower voltages and remain transparent at a thickness in the range of microns instead of nanometers as compared to gold conductive coatings. As such, transparent conductive oxides extend the performance and thickness threshold before becoming too opaque to visible light.Generally, in the applications mentioned above, the transparent conductive film requires high visible-light transmittance in addition to high conductance, superior durability, and process ability such as coating or film formation. It is important to control film thickness and homogeneity. Generally, there are two ways to control film thickness and homogeneity. One way is to provide a process that creates thin and homogeneous coatings. These processes include, but are not limited to, chemical vapor deposition (CVD), sputtering and evaporation-condensation techniques. A second way to control film thickness and homogeneity is to provide materials that facilitate the formation of thin and homogeneous coatings. Sputtering processes require tight controls on raw materials. This disclosure focuses on the creation of materials that encourage thin and homogenous coatings.

Evaporation and condensation techniques are used to deposit gold and other transparent conductive oxide materials. These processes can be slow, time consuming and require tight controls of the environment. Sputtering these materials can be more forgiving since the material is not as intimately reacting with the environment.

Sputtering techniques also provide for the deposition of larger quantities of a material within a specific time period. Transparent oxide sputtering targets are made by traditional ceramic processing techniques and include ceramic crystals in the targets result in the sputtering of these crystals during the deposition process. If the crystal size is too large, the sputtered thickness will be too thick, making the film opaque. Chunks of material also prevent even current distribution in the sputtered film, negatively impacting the performance of the device.

Ceramic powders are usually an order of magnitude larger than the intended coating. Traditional ceramic processing of ceramic powders has been used to create transparent conductive oxide sputtering targets. The larger particle size of traditional ceramics extend the diffusion time required for the diffusion of dopants into the crystals. Since the film thickness is usually on the order of microns and ceramic powders are commonly ground to sizes on the order of 10's of microns, grinding transparent conductive materials requires challenging and tedious processing. The grinding, target-forming, and application processes must overcome the complications associated with the larger particle sizes of the raw material. Porosity in sputtering targets formed by traditional ceramic processing techniques also creates a problem.

Processing materials to fine particle sizes also creates several problems in traditional ceramic processing. Fine particle size powders have significant surface energy and agglomerate into porous clusters. These clusters take time and energy to sinter out. Sintering occurs at temperature near grain growth, which is the initial issue. If the porosity is not removed, these clusters can be sputtered instead of individual grains. Clusters create several surfaces that reflect and scatter light. Reflection and scattering decrease the transparency of the material. Thus, there continues to be a need to provide improved processes for forming transparent oxide material targets.

SUMMARY OF INVENTION

One aspect of the present invention relates to a method of manufacturing indium zinc oxide articles. According to one or more embodiments, the method includes melting zinc oxide and indium oxide source materials into a liquid and cooling the liquid in a mold to form a fusion cast indium zinc oxide article. In some embodiments, the liquid is substantially homogenous. According to certain embodiments, the zinc oxide and indium oxide source materials are heated in a furnace to about 1850° C.

In one or more embodiments, the method further includes forming a thin layer of indium zinc oxide in the mold and cooling the thin layer. In these embodiments, the thin layer may be cooled to a temperature between about 300° C. and 400° C. Certain embodiments may include breaking away the mold from the thin layer. In some embodiments, the melting is performed in a cold top furnace. According to some embodiments, the zinc oxide source material includes zinc carbonate. In certain embodiments, the melt is cooled at a rate to allow crystallization to occur throughout the melt.

Another aspect of the invention relates to fusion cast indium zinc oxide articles. One ore more embodiments pertain to a sputtering target for use in the production of transparent electroconductive films.

Advantages of the various embodiments invention will be apparent from the following detailed description. It is to be understood that both the foregoing general description and the following detailed description are exemplary and are intended to provide further explanation of the invention as claimed.

BRIEF DESCRIPTION OF THE DRAWING

A more complete appreciation of the subject matter of the present invention can be realized by reference to the following detailed description in which reference is made to the accompanying drawing in which.

DETAILED DESCRIPTION

Figure 1:
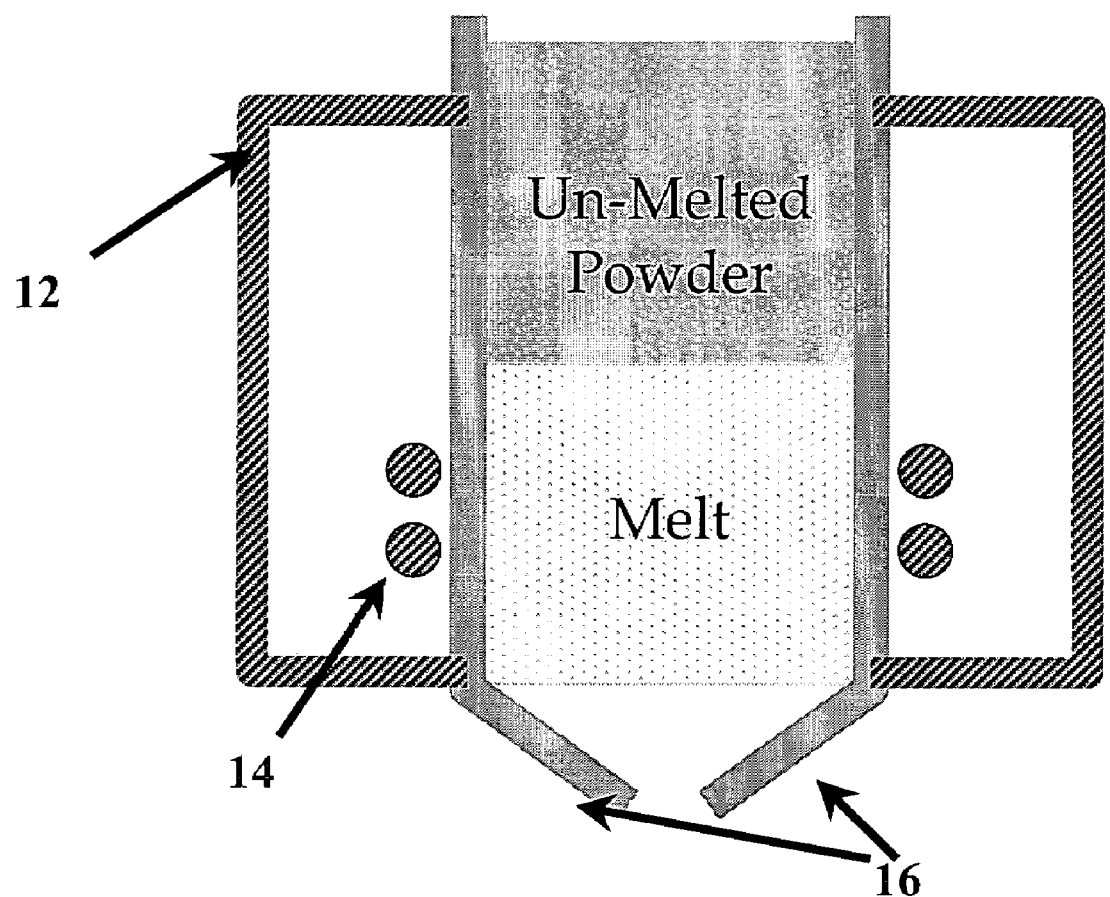
FIG. 1 is a schematic view of a furnace that can be used to manufacture fusion cast articles according to one or more embodiments of the present invention.

Before describing several exemplary embodiments of the invention, it is to be understood that the invention is not limited to the details of construction or process steps set forth in the following description. The invention is capable of other embodiments and of being practiced or being carried out in various ways.

One aspect of the present invention relates to fusion cast indium zinc oxide articles such as fusion cast indium zinc oxide sputtering targets. Another aspect of the invention relates to methods for manufacturing fusion cast indium zinc oxide articles. According to one or more embodiments of the present invention, fusion cast indium zinc oxide articles are manufactured by novel fusion casting processes described herein.

Fusion casting processes have been used to manufacture refractory materials requiring fine particle size and low porosity. As used herein, the term fusion cast and fusion casting refers to a process in which the raw materials have been melted into a liquid, preferably a homogeneous liquid. This liquid is cooled in a manner to allow crystallization to occur throughout the melt. Because the entire melt crystallizes from several points, the particle size remains relatively small. A properly controlled fusion casting process allows the trapped gasses in the melt to escape, and generally, there is typically no internal porosity in the finished material. The liquid phase formed during fusion casting is more efficient at dispersing dopants into a crystalline material.

Traditional ceramic forming of indium zinc oxide articles involves several sintering and crushing operations. During each step, the zinc diffuses further into the structure of the crystal. The ceramic is then crushed, exposing high indium oxide and high zinc concentrations. The crushed powder is reheated and crushed until the zinc is fully dispersed through the indium oxide crystals. If the indium oxide and zinc oxide materials are melted into a liquid, the diffusion process occurs rapidly. Rapid diffusion eliminates the need for sintering and re-crushing.

Applicant believes that the fusion casting process had not been used to produce transparent conductive oxide articles such as indium zinc oxide sputtering targets. Indium and zinc have high vapor pressures approaching their melting points. The use of cold top melting is expected to re-condense the material back into the melt, thus eliminating vaporization of components that have high vapor pressures close to their melting points. Fusion casting of materials such as alumina, zirconia and silica does not result in the vaporization of the materials at fusion casting temperatures. An example of a top-melting apparatus that can be used in one or more embodiments of the present invention is shown in FIG. 1. The apparatus 10 shown in FIG. 1 includes a furnace wall 12, which can be made from carbon or other suitable refractory material. Heating elements 14 can be made from carbon or other suitable materials. The walls 12 and the heating elements 14 surround a refractory tube 16, for example, a platinum-rhodium tube. Nitrogen gas or other inert gases can be flowed into the furnace chamber to inhibit oxidation of the furnace materials. Unmelted powder raw materials are fed through the top of the furnace, and the materials melt as they flow through the hot zone of the furnace.

Cold top melters have been used for glasses with high vapor pressures but cannot handle the temperatures. Borosilicate glasses have been made using a cold top melter. These borosilicate glasses melt at 1000° C. Fusion casting of transparent conductive oxides compositions containing indium and zinc oxide require temperatures near 1900° C., depending upon the composition.

A variety of compositions of indium oxide and zinc oxide can be used. For example, 2-100% indium oxide and 2-100% zinc oxide can be used. Non-limiting examples of useful compositions that can be used in accordance with embodiments of the present invention include, but are not limited to the compositions disclosed in U.S. Pat. Nos. 5,628,933 and 6,534,183, both of which are incorporated herein by reference. In addition, U.S. Pat. Nos. 5,628,933 and 6,534,183 are both incorporated herein by reference for their disclosure of techniques for forming coatings or thin films of conductive oxides.

Zinc oxide source materials can be provided in many forms. Zinc carbonate is a preferred source of zinc oxide for melting since the decomposition of zinc carbonate during the melting process will stir the melt and displace nitrogen and oxygen. Other examples of potential source materials include zinc sulphate, zinc oxide, and zinc chloride are other sources of zinc.

Indium oxide source materials can also be provided in many forms. Examples of such source materials include indium sulfate, indium oxide indium nitrate and indium acetate are additional sources of indium oxide. One difficulty in fusion casting indium oxide will be melting the form of indium oxide with available melting containers because indium oxide melts in excess of 1900° C. Melting high indium content compositions will require high temperature crucibles to handle the heat, for example, a platinum-rhodium 70%/30% crucible. In embodiments in which zinc carbonate is used as a raw material, the stirring action of the zinc carbonate will reduce the melting temperature of the indium zinc oxide blend. Blends of zinc oxide and indium oxide containing higher amounts of zinc oxide will require lower melting temperatures.

According to one or more embodiments, other methods can be used for melting indium zinc oxide compositions at high volumes. These techniques include, but are not limited to the use of electrodes to heat indium zinc oxide in a water-cooled crucible. The water-cooled crucible keeps the powder temperature lower at the perimeter. Lower processing temperatures permit lower temperature crucible materials to be used, for example, alumina, which could contaminate the blend if exposed to high temperatures.

Without intending to limit the invention in any manner, the present invention will be more fully described by the following example.

EXAMPLE

Mold Preparation

According to one or more embodiments of the present invention, indium zinc oxide articles can be manufactured by forming a sample in a mold. A mold can be manufactured by forming a zirconium oxide sand mold to the negative image of the final desired product. Such a mold can be made by forming a zirconium oxide slurry with any a small content (for example, approximately 0.5%) of an organic binder using techniques known in the art. The zirconium oxide content of the slurry is increased until the slurry is dilatant. A positive image of the desired final product such as a sputtering target is then imprinted into the slurry. The slurry is then dried at a temperature elevated from room temperature, for example at approximately 100° C. until the water in the slurry evaporates. Water should be completely removed, as it is believed that water will hinder the performance of the transparent conductive oxide formed in the target. As will be understood by those skilled in the art, thicker molds should be dried at lower temperatures to prevent the mold from explosive drying.

The zirconium oxide sand can be coarse, for example, between 50 mesh to 100 mesh, which should be sufficient to allow rapid evaporation without explosive drying. Finer mesh powder will require longer drying at lower temperature. Coarser mesh powder will decrease drying time but may require higher binder content or more specialized binders.

The zirconium oxide sand mold is then heated to approximately 350° C. Preheating the zirconium sand mold will decrease the thermal shock of rapid cooling to room temperature. Between temperatures of about 300° C. and 400° C., the crystallization growth rate of the indium zinc oxide melt will remain slow.

Melting

After the indium oxide and zinc oxide source materials have been mixed, they are heated and maintained to temperatures of at least about 1850° C. until the desired level of bubbles have risen and evolved from the indium zinc oxide melt. The melting temperature of about 1850° C. corresponds to high indium melts or high zinc oxide melts. It will be understood by those of skill in the art that the melting temperature may need to be adjusted based on the percentage of indium and zinc in the melt.

It will be understood that the reduction of indium oxide and zinc oxide vapor losses will reduce costs. Indium zinc oxide vapors will also evolve from the melt, and trapping those vapors is beneficial in reducing material costs for future melts. The use of a cold top furnace in either a platinum crucible or a water-cooled crucible will decrease the evolution of the indium oxide and zinc oxide vapors.

Pouring a thin sheet waterfall of the indium zinc oxide melt from the crucible vessel into the mold will also remove larger bubbles during the pouring process. Pouring a thin sheet decreases the distance bubbles have to travel to evolve from the melt. Pouring a thin sheet also increases the volatility of indium and zinc oxide from the melt.

Forming

The contents of the melt in the crucible are poured in the preheated zirconium oxide sand mold. The zirconium oxide should not dissolve into the indium zinc oxide melt. A skin of the indium zinc oxide should form on contact with the cooler zirconium oxide wall, and after the skin forms, the zirconium oxide mold walls can be broken away and removed and the indium zinc oxide melt can be allowed to cool in air between about 300° C. and 400° C. to form a skin, which can then be used as a mold. The skin will quickly develop on the melt poured in the mold. It is believed that leaving the zirconium oxide mold wall against the indium zinc oxide melt will insulate the glass phase and allow for larger crystals to grow. Applicant believes that too much crystal growth is an undesirable feature that should be avoided.

To prevent cracking of the fusion cast article during cooling, the zirconium oxide sand mold should remain loose. The melt can naturally shrink inside the mold during cooling. Natural shrinkage prevents the mold from transferring stress back into the cooling melt. The melt will cool from the outside inward. Once the melt has cooled, the fusion cast indium zinc oxide article can be used as a sputtering target for forming transparent conductive indium zinc oxide films using techniques known to those skilled in the art. Decreasing or otherwise varying the cooling rate will generate different levels of crystallization in the fusion cast article.

It will be apparent to those skilled in the art that various modifications and variations can be made to the present invention without departing from the spirit or scope of the invention. Thus, it is intended that the present invention cover modifications and variations of this invention provided they come within the scope of the appended claims and their equivalents.

What is claimed is:

1. A method of manufacturing indium zinc oxide articles comprising:
   melting zinc oxide and indium oxide source materials into a liquid; and
   cooling the liquid in a mold to form a fusion cast indium zinc oxide article.

2. The method of claim 1, wherein the liquid is substantially homogenous.

3. The method of claim 1, wherein the zinc oxide and indium oxide source materials are heated in a furnace to at least about 1850° C.

4. The method of claim 1, further comprising forming a thin layer of indium zinc oxide in the mold and cooling the thin layer.

5. The method of claim 4, wherein the thin layer is cooled to a temperature between about 300° C. and 400° C.

6. The method of claim 4, further comprising breaking away the mold from the thin layer.

7. The method of claim 6, wherein the melting is performed in a cold top furnace.

8. The method of claim 7, wherein the zinc oxide source material includes zinc carbonate.

9. The method of claim 8, further comprising cooling the melt at a rate to allow crystallization to occur throughout the melt.

10. The method of claim 8, wherein the article formed thereby is a sputtering target.

11. The method of claim 9, wherein the article formed thereby is a sputtering target.

* * * * *